(12) United States Patent
Shih et al.

(10) Patent No.: US 6,468,921 B1
(45) Date of Patent: Oct. 22, 2002

(54) THIN-FILM FORMING METHOD

(75) Inventors: Hon-Ling Shih; Chung-Chieh Juan; Fu-Chun Chen; An-Chow Chen, all of Hsinchu (TW)

(73) Assignee: Winbond Electronics Corp., Hsinchu (TW)

( * ) Notice: Subject to any disclaimer, the term of this patent is extended or adjusted under 35 U.S.C. 154(b) by 0 days.

(21) Appl. No.: 09/967,582

(22) Filed: Sep. 26, 2001

(51) Int. Cl.[7] .............................................. H01L 21/31
(52) U.S. Cl. ..................... 438/758; 438/623; 438/624; 438/150; 257/759; 257/760
(58) Field of Search ................................. 438/758, 623, 438/624, 150, 166; 257/759, 760

(56) References Cited

U.S. PATENT DOCUMENTS

| | | | | |
|---|---|---|---|---|
| 5,530,376 A | * | 6/1996 | Lim et al. | 324/765 |
| 6,015,990 A | * | 1/2000 | Hieda et al. | 257/310 |
| 6,117,777 A | * | 9/2000 | Zhou et al. | 438/692 |
| 6,127,238 A | * | 10/2000 | Liao et al. | 438/382 |
| 6,133,583 A | * | 10/2000 | Ohtani et al. | 257/57 |
| 6,265,302 B1 | * | 7/2001 | Lim et al. | 438/622 |
| 6,265,303 B1 | * | 7/2001 | Lu et al. | 438/623 |
| 6,271,132 B1 | * | 8/2001 | Xiang et al. | 438/682 |
| 6,291,278 B1 | * | 9/2001 | Xiang et al. | 438/197 |
| 6,297,126 B1 | * | 10/2001 | Lim et al. | 438/424 |
| 6,323,072 B1 | * | 11/2001 | Yamazaki et al. | 438/166 |
| 6,350,661 B2 | * | 2/2002 | Lim et al. | 438/424 |
| 6,351,039 B1 | * | 2/2002 | Jin et al. | 257/759 |

* cited by examiner

Primary Examiner—John F. Niebling
Assistant Examiner—Olivia T Luk
(74) Attorney, Agent, or Firm—Gazdzinski & Associates

(57) ABSTRACT

A thin-film forming method applied in an IC manufacturing process is disclosed. The thin-film forming method is used for forming a thin film on a topographically rugged substrate with an improved evenness. The method is characterized in that after a depositing step for forming the thin film is finished, the thin film is continuously ion bombed for a specific time to improve the evenness of the thin film.

11 Claims, 4 Drawing Sheets

THIN-FILM FORMING METHOD

FIELD OF THE INVENTION

The present invention is related to a thin-film forming method which can form a thin film with an improved evenness.

BACKGROUND OF THE INVENTION

With the progresses of IC manufacturing methods, the aspect ratio of a multilayer semiconductor device increase as the integrated density increases. As a result, a thin-film forming method with an improved gap-filling ability is getting more and more attention.

FIG. 1 schematically shows a conventional high density plasma chemical vapor deposition (HDPCVD) method which is wildly used by semiconductor manufacturers nowadays. The HDPCVD utilizes instantaneously depositing and etching steps to improve the gap-filling ability of a thin film. For example, as shown in FIG. 1(a), when a $SiO_2$ thin film 12 is deposited from silane ($SiH_4$) and oxygen ($O_2$) on a topographically rugged substrate 10 which has a device structure 11 thereon, a bias radiofrequency (bias RF) is instantaneously used to accelerate ions (such as argon, helium or oxygen ions) in the plasma to ion bomb the $SiO_2$ thin film 12. Therefore, the burs of the thin film 12 formed around the voids and gaps are destroyed by the ion bombing and the crashed dregs are filled into the voids and gaps, as shown in FIG. 1(b).

As described above, the HDPCVD can effectively improved the gap-filling ability of a thin film on a topographically rugged substrate, but many triangle peaks will be left, as shown in FIG. 1(c). The triangle peaks cannot be easily ground to be flat by the chemical mechanical polishing (CMP) because the grinding solution 13 is trapped in the concave grooves between the triangle peaks (the grinding solution 13 can not distribute uniformly). Therefore, the grinding time of CMP needs to be extended, otherwise the grinding effect of CMP will be poor.

It is therefore attempted by the present applicant to deal with the above situation encountered with the prior art.

SUMMARY OF THE INVENTION

An object of the present invention is to provide a novel thin-film forming method applied in an IC manufacturing process for forming a thin film with an improved evenness. The method includes the step of (a) forming a thin film on a topographically rugged substrate, (b) ion bombing the thin film to improve a gap-filling ability of the thin film, (c) after the thin-film forming step is finished, ion bombing the thin film continuously for a specific time to improve the evenness of the thin film.

According to the present invention, the thin film is formed by a chemical vapor deposition method, preferably the high density plasma chemical vapor deposition method.

The thin film of the present invention is a silicide layer, preferably a $SiO_2$ layer. The thin film is ion bombed by using a bias radio-frequency to accelerate ions in a plasma, and the ions are argon, helium or oxygen ions.

According to the present invention, the depositing step and the ion bombing step are processed in the same machine.

The present invention may best be understood through the following description with reference to the accompanying drawings, in which:

DETAILED DESCRIPTION OF THE PREFERRED EMBODIMENTS

Figure 1A:
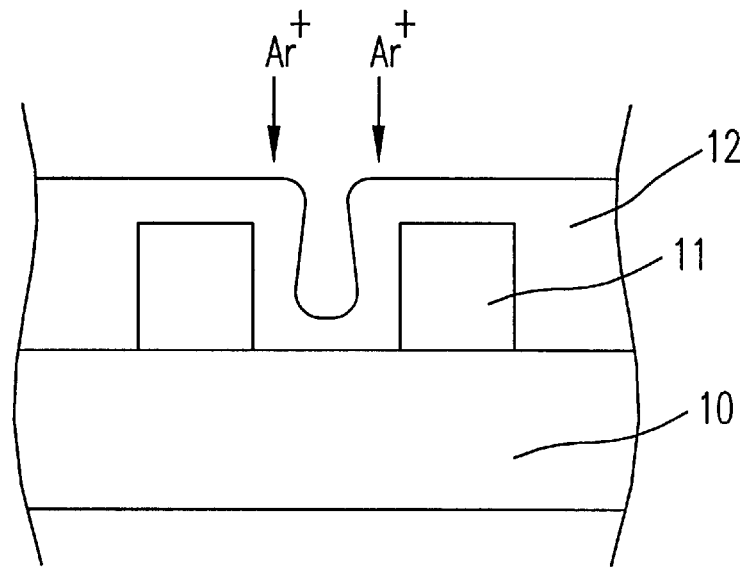
FIG. 1(a) schematically shows the conventional high density plasma chemical vapor deposition (HDPCVD) method.
Figure 1B:
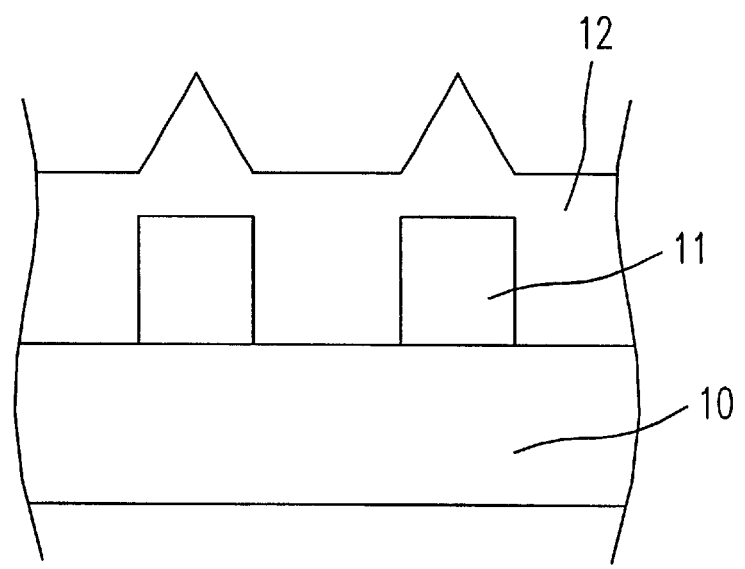
FIG. 1(b) schematically shows the triangle peaks left on the substrate after the HDPCVD of FIG. 1(a)
Figure 1C:
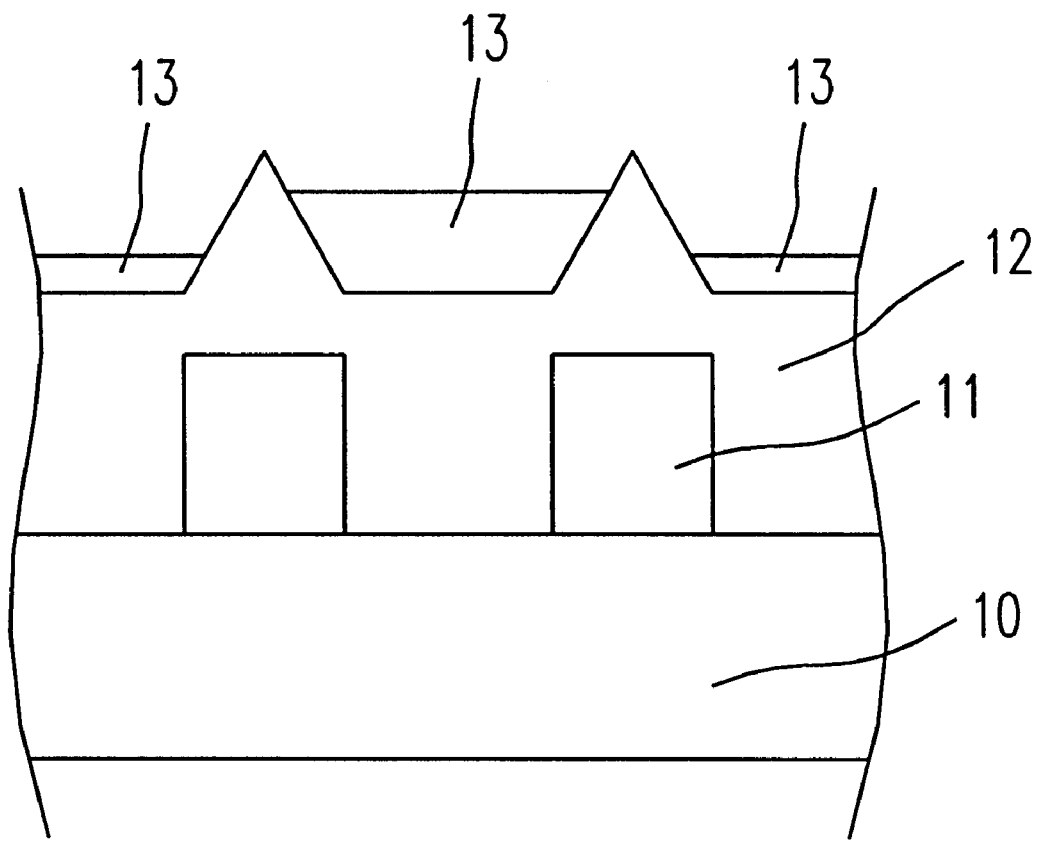
FIG. 1(c) schematically shows the distribution situation of the grinding solution in FIG. 1(b)
Figure 2A:
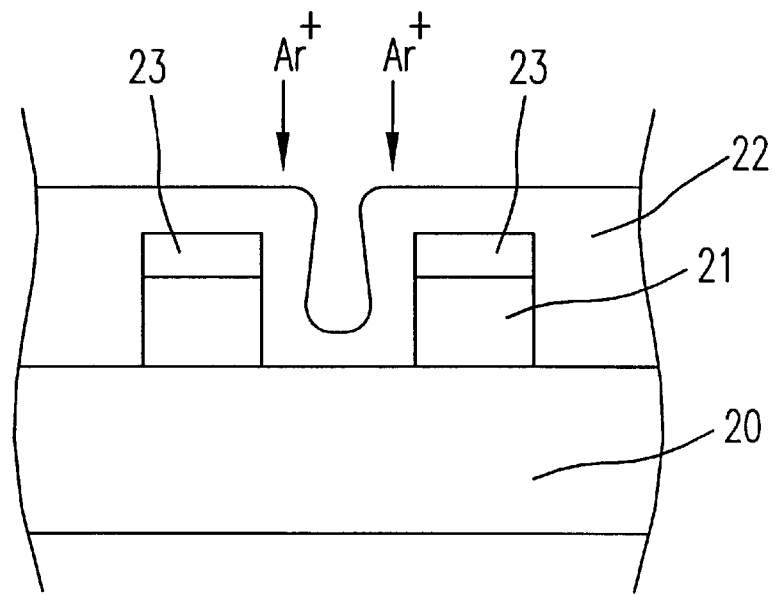
FIGS. 2(a), (b) and (c) schematically show a preferred embodiment of the thin-film forming method according to the present invention.
Figure 2B:
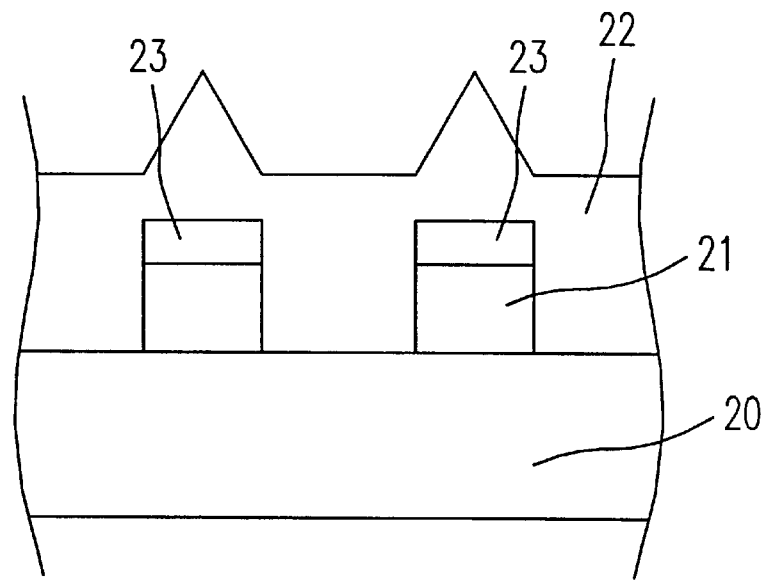

FIGS. 2(a), (b) and (c) show a preferred embodiment of the thin-film forming method according to the present invention, and the thin-film forming method of the present invention is directed against the drawbacks of the conventional HDPCVD because of the triangle peaks. Taking a $SiO_2$ thin film 22 formed from silane ($SiH_4$) and oxygen gas ($O_2$) by HDPCVD (the flow rate of silane is 20~150 sccm, the flow rate of oxygen gas is 100~200 sccm, the flow rate of $Ar^+$ is 0~200 sccm, the temperature is 600° C., and the pressure is 1~5 mtorr) on a topographically rugged substrate 20 with an IC device structure 21 and a silicon nitride layer 23 thereon for example, a bias radiofrequency (bias RF) is instantaneously used to accelerate the argon ions ($Ar^+$) in the plasma to ion bomb the $SiO_2$ thin film 22, as shown in FIG. 2(a). Therefore, the burs of the thin film 22 formed around the voids and gaps are destroyed by the ion bombing, and the voids and gaps are filled to be flatter by the crashed dregs, as shown in FIG. 2(b).

Figure 2C:
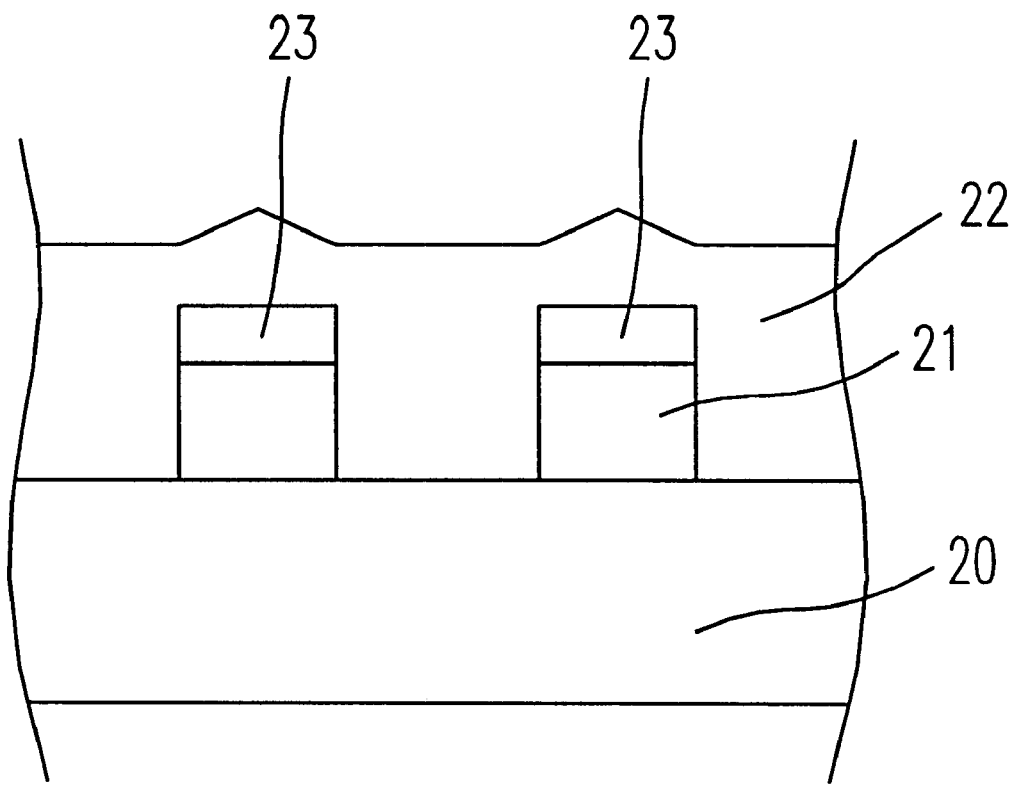

The processes described above presently are the same to the convention HDPCVD method. However, in order to remove the triangle peaks of the thin film formed by HDPCVD and to increase the polishing efficiency of the following CMP process, after HDPCVD for forming the thin film 22 is finished, the thin film 22 is continuously ion bombed in the same machine for a specific time to improve the evenness of the thin film 22. Therefore, as shown in FIG. 2(c), the height of the triangle peaks of the thin film 22 is lowered so that the polishing efficiency of the following CMP process is improved.

The comparing results of the convention HDPCVD and the thin-film forming method of the present invention are listed in Table 1.

TABLE 1

The CMP polishing time, remaining thickness of $SiO_2$ film, evenness of $SiO_2$ film, and thickness of silicon nitride layer under different thin-film forming methods (T = 600° C., P = 5 mtorr)
(Evenness = ((Max. − Min.)/Average)%)

|  | Polishing time (sec) | Remaining thickness of $SiO_2$ film (Å) | Evenness (%) | Thickness of silicon nitride layer (Å) |
|---|---|---|---|---|
| HDPCVD for 60 sec | 255 | 363 | 271 | 1142 |
| HDPCVD for 60 sec + extra ion bombing for 10 sec | 179 | 76 | 177 | 1170 |

TABLE 1-continued

The CMP polishing time, remaining thickness of SiO$_2$ film, evenness of SiO$_2$ film, and thickness of silicon nitride layer under different thin-film forming methods (T = 600° C., P = 5 mtorr)
(Evenness = ((Max. − Min.)/Average)%)

| | Polishing time (sec) | Remaining thickness of SiO$_2$ film (Å) | Evenness (%) | Thickness of silicon nitride layer (Å) |
|---|---|---|---|---|
| HDPCVD for 60 sec + extra ion bombing for 20 sec | 150 | 76 | 199 | 1164 |

As shown in Table 1, if the SiO$_2$ film is not ion bombed continuously after the conventional HDPCVD method, the CMP polishing time for removing the triangle peaks of SiO$_2$ film needs to be over 255 seconds. In addition, the remaining thickness of SiO$_2$ film is 363 Å, the evenness of SiO$_2$ film is 271%, and the thickness of silicon nitride layer is 1142 Å. However, if the SiO$_2$ film is extra ion bombed for 10 seconds after the conventional HDPCVD method in the same machine (this is the thin-film forming method of the present invention), the CMP polishing time for removing the triangle peaks of SiO$_2$ film is lowered to be 179 seconds. In addition, the remaining thickness of SiO$_2$ film is lowered to be 76 Å, and the evenness of SiO$_2$ film is improved to be 177%. The thickness of silicon nitride layer still maintains the level of 1142 Å. Further, if the SiO$_2$ film is extra ion bombed for 20 seconds after the conventional HDPCVD method in the same machine (this is the thin-film forming method of the present invention), the CMP polishing time for removing the triangle peaks of SiO$_2$ film is lowered to be 150 seconds. In addition, the remaining thickness of SiO$_2$ film is lowered to be 76 Å, and the evenness of SiO$_2$ film is improved to be 199%. The thickness of silicon nitride layer still maintains the level of 1164 Å.

From the above discussion, it is understood that the thin-film forming method of the present invention can effectively reduce the height of the triangle peaks of the thin film formed by HDPCVD so as to save the CMP polishing time without alter any characteristics of the IC device. Therefore, the manufacturing efficiency is increased.

While the invention has been described in terms of what are presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A thin-film forming method applied in an IC manufacturing process for forming a thin film on a topographically rugged substrate with an improved evenness characterized in that after a depositing step for forming said thin film is finished, ion bombing said thin film for a specific time to improve said evenness of said thin film.

2. The method according to claim 1 wherein said depositing step is a chemical vapor deposition method.

3. The method according to claim 2 wherein said chemical vapor deposition method is a high density plasma chemical vapor deposition method.

4. The method according to claim 1 wherein said thin film is a silicide layer.

5. The method according to claim 4 wherein said silicide layer is SiO$_2$.

6. The method according to claim 1 wherein said thin film is ion bombed by using a bias radio-frequency to accelerate ions in a plasma.

7. The method according to claim 6 wherein said ions are selected from argon, helium and oxygen.

8. The method according to claim 1 wherein said depositing step and said ion bombing step are processed in the same machine.

9. The method according to claim 1 wherein after said ion bombing step, said thin film is polished by a chemical machine polishing method.

10. The method according to claim 1 wherein said specific time is 10 seconds.

11. The method according to claim 1 wherein said specific time is 20 seconds.

* * * * *